United States Patent [19]
Kulwicki

[11] Patent Number: 5,434,410
[45] Date of Patent: Jul. 18, 1995

[54] FINE-GRAIN PYROELECTRIC DETECTOR MATERIAL AND METHOD

[75] Inventor: Bernard M. Kulwicki, North Attleboro, Mass.

[73] Assignee: Texas Instruments Incorporated, Dallas, Tex.

[21] Appl. No.: 198,927

[22] Filed: Feb. 18, 1994

Related U.S. Application Data

[62] Division of Ser. No. 890,891, May 29, 1992.

[51] Int. Cl.$^6$ .................... H01L 31/0264; G01J 5/00
[52] U.S. Cl. .................................................. 250/338.3
[58] Field of Search ..................................... 250/338.3

[56] References Cited
U.S. PATENT DOCUMENTS

| | | | |
|---|---|---|---|
| 4,740,700 | 4/1988 | Shaham et al. | 250/332 |
| 4,983,839 | 1/1991 | Deb | 250/338.3 |
| 5,130,542 | 7/1992 | Sibbald et al. | 250/338.3 |

FOREIGN PATENT DOCUMENTS 298681  3/1992  German Dem. Rep. ........ 250/338.3

*Primary Examiner*—Constantine Hannaher
*Attorney, Agent, or Firm*—Brian A. Carlson; James C. Kesterson; Richard L. Donaldson

[57] ABSTRACT

An improved pyroelectric material comprises a polycrystalline material doped with at least one donor element such that the polycrystalline material has a grain size less than 10 μm (or 5 μm) and a Figure of Merit greater than 90 nC/(cm$^2$*K). In the preferred embodiments the polycrystalline material is barium strontium titanate or calcium-substituted barium strontium titanate. The donor element may be Nb, Ta, Bi, Sb, Y, La, Ce, Pr, Nd, Sm, Gd, Tb, Dy, Ho, Er or a combination thereof. The material may additionally be doped with an accepter such as Co, Cu, Fe, Mn, Ru, Al, Ga, Mg, Sc, K, Na, U, In, Mg, Ni, Yb or a combination thereof to control the resistivity. Other structures and methods are also disclosed.

10 Claims, 6 Drawing Sheets

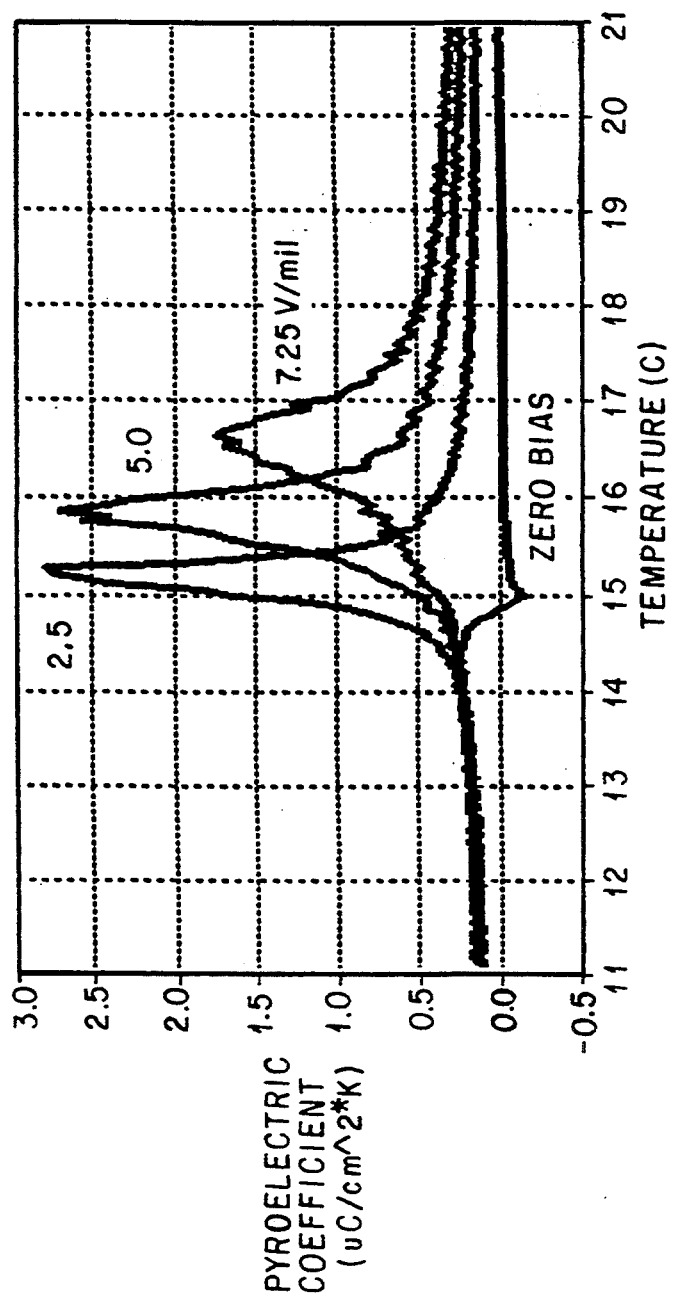

FINE-GRAIN PYROELECTRIC DETECTOR MATERIAL AND METHOD

This is a division, of application Ser. No. 07/890,891, filed May 29, 1992.

CROSS REFERENCES TO RELATED APPLICATIONS

The following related applications were filed concurrently with the instant application:

The following co-assigned applications are related to the instant application: Ser. No. 08/173,815, filed 23 Dec. 1993, entitled "PB Substituted Perovskites for Thin Film Dielectrics" by Summerfelt et al., which is a continuation of Ser. No. 07/891,508, filed 29 May 1992, now abandoned; Ser. No. 08/177,838, filed 7 Mar. 1994, entitled "Donor Doped Perovskites for Thin Film Dielectrics" by Summerfelt et al., which is a continuation of Ser. No. 07/891,560, filed 29 May 1992, now abandoned.

FIELD OF THE INVENTION

This invention generally relates to semiconductor materials and devices and specifically to a fine-grain pyroelectric detector material, structure and method.

BACKGROUND OF THE INVENTION

Detection of infrared radiation emitted by warm bodies provides an important method for night vision (perception without visible light). Infrared detectors may be classified in various ways, such as scanning or staring arrays, cryogenic (typically liquid nitrogen temperatures) or uncooled detectors, 3–5 micron or 8–12 micron spectral sensitivity range, and photon or thermal detection mechanism.

Cryogenic infrared detectors are typically made of small bandgap (about 0.1–0.2 eV) semiconductors such as HgCdTe and operate as photo-diodes or photocapacitors by photon absorption to produce electron-hole pairs. On the other hand, uncooled infrared detectors cannot make use of small bandgap semiconductors because the bandgap is only about four times the thermal energy (4kT) at room temperature and dark current swamps any signal. Consequently, uncooled infrared detectors rely on the other physical phenomena and are less sensitive than cryogenic detectors but do not require cooling apparatus or its energy consumption. Typically, the preferred choice for an uncooled detector is a thermal detector. The thermal detector is usually one of three types: (1) pyroelectric detector, (2) thermocouple, or (3) bolometer.

A very good pyroelectric detector uses a ferroelectric ceramic material (such as $BaSrTiO_3$) at operating temperatures typically between about 0° C. and 150° C. The preferred ferroelectric materials have a large change in spontaneous dielectric polarization at operating temperatures, and the heating of the ferroelectric is detected by sensing the induced voltage created by the generation of charge across a capacitor with the ferroelectric as insulator.

Prior art approaches, however, suffer from processing difficulties which limit the array resolution and quality of devices fabricated. Accordingly, improvements which overcome any or all of the problems are presently desirable.

SUMMARY OF THE INVENTION

Other objects and advantages will be obvious, and will in part appear hereinafter and will be accomplished by the present invention which provides a material and method for a fine-grain pyroelectric detector.

An improved pyroelectric material comprises a polycrystalline material doped with at least one donor element such that the polycrystalline material has a grain size less than 10 $\mu$m (or less than 5 $\mu$m, e.g., 1–2 $\mu$m) and a Figure of Merit greater than 90 $nC/(cm^{2}*K)$. In the preferred embodiments the polycrystalline material is barium strontium titanate or calcium-substituted barium strontium titanate. The donor element may be Nb, Ta, Bi, Sb, Y, La, Ce, Pr, Nd, Sm, Gd, Tb, Dy, Ho, Er or a combination thereof. The material may additionally be doped with an acceptor such as Co, Cu, Fe, Mn, Ru, Al, Ga, Mg, Sc, K, Na, U, In, Mg, Ni, Yb or a combination thereof to control the resistivity.

A method of forming a pyroelectric material for use in a thermal detector is also disclosed. In a preferred embodiment, barium acetate, strontium acetate, calcium nitrate, a nitrate salt of a donor ion, tetraisopropyl titanate, lactic acid and water are combined to form a common solution. The common solution is then directly pyrolized to form a mixed oxide. The mixed oxide is crushed to form a fine powder and the fine powder is pressed into a block. The block is then sintered at a selected temperature (e.g., 1450° C.) in oxygen to form a ceramic with a selected density (e.g., >99% or theoretical, i.e., pore volume <1%).

An advantage of the invention is that the grain density per pixel increases by approximately three orders of magnitude as compared to prior art materials that have typically 20 $\mu$m grain size. This increase in grain density averages the grain orientations and therefore reduces pixel to pixel property variations. With undoped materials, on the other hand, high pyroelectric response cannot be achieved in undoped BST unless the grain size is greater than 10 $\mu$m or so.

In addition, polishing undoped BST results in surface damage. The damaged layer can be removed by etching, but the residual salts can be conductive, so that surface leakage currents can become a serious problem in the application. At present, it is unclear if similar surface damage occurs with the doped, fine-grain material, but if it does and etching is desirable, the high density of the latter would be beneficial to inhibit penetration of the etchant.

Additionally, experience has shown that high pyroelectric response cannot be achieved in undoped BST unless the grain size is greater than 10 $\mu$m or so. If the grains are too big other problems arise, such as poor mechanical properties. For example, high incidence of pullouts during polishing may occur leading to missing pixels and therefore high fixed pattern noise. Other problems occur due to large pixel-pixel variation in crystallite orientation and pyroelectric response.

Further, for undoped BST, the ideal grain size is 10 to 20 $\mu$m and the maximum density readily achievable is 96 to 98%. This leaves considerable open porosity for absorption of etchants and other processing liquids. The doped materials are typically more than 99% dense, so problems relating to porosity should diminish.

Another advantage is that the grain surface area is larger by two orders of magnitude (due to smaller grain size, that is more grains) providing greatly increased capability to distribute second (liquid) phases that occur during sintering due to deviation from ideal stoichiometry. Thus, the fine-grain material should exhibit significantly increased tolerance to compositional and processing variations thereby making it easier to manufacture controllably.

Still further, fine-grain ceramics tend to sinter to higher densities than coarse-grained (e.g., 99% of theoretical or greater is common). Still further yet, electrical aging is much less severe in fine-grain ceramics.

Yet another advantage is that fine-grained ceramics are stronger that coarse grained, providing improved ability to handle thin sections in a high volume manufacturing operation.

BRIEF DESCRIPTION OF THE DRAWINGS

The above features of the present invention will be more clearly understood from consideration of the following descriptions in connection with accompanying drawings in which:

FIG. 4 illustrates the pyroelectric coefficient for a sample of BST doped with 0.7% mole % Y and 0.1 mole % Mn as a function of temperature and DC bias;

Corresponding numerals and symbols in the different figures refer to corresponding parts unless otherwise indicated.

DETAILED DESCRIPTION OF PREFERRED EMBODIMENTS

Figure 1:
FIG. 1 illustrates the microstructure of an undoped sample of BST.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the present invention. First, a brief overview of some of the problems associated with prior art methods will be discussed along with some corresponding goals and advantages of the present invention. The preferred embodiment material will then be described including some nominal composition formulas. A process for making the material will be described and a brief discussion of experimental test results will also be included. Finally, an exemplary infrared detector array and cell structure will be briefly described.

One object of the invention is to develop improved ceramic grain size, density, and homogeneity with no degradation in infrared detection performance. The improved material should improve image quality and processing yield as well as pyroelectric Figure of Merit (FoM).

In a first operating mode, standard pyroelectric detectors utilize ferroelectric sensing material that has a high Curie temperature (e.g., lead zirconate titanate or PZT, $T_c \sim 350°$ C). The sensor layer is poled (i.e. polarized by application of high dc electric field at elevated temperature and slowly cooled with the field applied). In the application the device operates well below the Curie temperature ($T_c$), without a substantial DC bias. The pyroelectric currents are relatively small, necessitating large pixel area (low resolution for a compact structure).

A second operating mode is called a dielectric bolometer mode and until now has not been significantly applied in commercial products. In this mode, the detector material operates at the Curie point to take advantage of the high pyroelectric signal, enabling small pixel size and high resolution in a compact structure. DC bias is required to maintain the polarization. In the preferred embodiment, this invention applies to materials primarily useful in this second mode.

Present uncooled infrared imaging detectors rely on undoped ceramic barium strontium titanate (BST) or calcium-substituted BST (Ca-BST) as detectors utilizing the high pyroelectric current that occurs near the Curie temperature to sense a heat pattern focused from a source object or scene to produce a thermal image of it. It is desirable to have a high pyroelectric Figure of Merit in order to maximize the signal to noise ratio. If the device is circuit noise limited, the appropriate voltage response is:

$$\frac{dE}{dT} = \frac{p_{max}}{(\epsilon^* \epsilon_0)}$$

where E is the electric field, T is temperature, $P_{max}$ is the maximum pyroelectric coefficient, $\epsilon$ is the dielectric constant and $\epsilon_0$ is the permitivity of free space ($8.85 \times 10^{-12}$ F/m).

On the other hand, if the: device is detector noise limited, the relevant Figure of Merit (FoM) is proportional to:

$$FoM = \frac{p_{max}}{\sqrt{\epsilon^* D}}$$

where D is the dielectric loss tangent. With new VLSI circuitry, devices will typically become detector noise limited.

The highest value of FoM known to be reported in the literature for BST is 90 nC/(cm$^{2*}$K), and the highest value for any material is about 130, for lead scandium tantalate (Whatmore, et al., Ferroelectrics, 1990, vol 104, pp 269-283). With the materials formed as described herein, Figure of Merit values greater than 90 nC/(cm$^{2*}$K) and greater than 130 nC/(cm$^{2*}$K) are possible. In fact, values in the range 150-300 nC/(cm$^{2*}$K) for BST and Ca-BST are routinely achieved and occasionally values as high as 800-1000 or even 1800 nC/(cm$^{2*}$K) have been achieved.

One problem exhibited by BST is degradation of the pyroelectric response due to thinning. For a long time, the pixel thickness was limited to values greater than 75 $\mu$m because of this degradation. The degradation is apparently caused by mechanical deformation of the surface layer during thinning. One approach is to remove the surface layer by etching and achieve acceptable response for pixel thicknesses in the range 37–50 μm. This is tricky in practice, however, since etching can leave ionically conductive residues behind that lead to unacceptable leakage currents. Introduction of the etching step also complicates the processing.

Additional problems relate to the grain size, which is typically in the range 10–30 μm for undoped materials with acceptable pyroelectric response. When the ceramic wafers are thinned by grinding and polishing, grain pullouts occur leaving voids behind. These voids can lead to missing pixels. Additionally, if etching is required, they provide an easy path for acid to penetrate through the entire thickness of the wafer thereby causing problems with leakage currents due to the ionic residue. Large grain size also infers that each pixel contains only a few grains; pixel to pixel variation in electrical response will be high due to the random nature of the grain orientations, and therefore the spontaneous and induced polarizations.

It is thus desirable to produce fine grain size material, i.e. grain size in the range 1–3 μm. The potential benefits compared to conventional large-grained materials include: 1) Grain density per pixel increases by approximately three orders of magnitude, averaging the grain orientations, and reducing pixel to pixel property variation accordingly. 2) Polishing damage is limited to only the surface grains, leaving the interior grains unaffected. This could make thinning of less than 75 μm feasible without etching. 3) Pullouts would be restricted to only the surface layers, so even with etching penetration of acid through the whole thickness would be greatly restricted. 4) Grain surface area increases by two orders of magnitude providing greatly increased capability to distribute second phases that occur due to deviation from ideal stoichiometry. Thus the fine-grain material should exhibit significantly increased tolerance to compositional and processing variations, making it easier to manufacture controllably. 5) Fine-grain ceramics tend to sinter to higher densities than coarse-grained (99% of theoretical is common) and also exhibit significantly better resistance to electrical aging. 6) Fine-grained ceramics are stronger than coarse grained, providing improved ability to handle thin sections in a high volume manufacturing operation.

Donor doping of pyroelectric materials such as BST inhibits oxygen vacancy formation and therefore restricts grain growth. For example, a trivalent element may be substituted for Ba or a pentavalent element substituted for Ti.

As such, one method to reduce grain growth in BST is to dope the material with donor ions such as Nb, Ta, Bi, Sb, Y, La or the lanthanide elements (for example, "Ln"=Ce, Pr, Nd, Sm, Gd, Tb, Dy, Ho, or Er). The lanthanides of atomic number greater than Er may be used but are typically not effective grain refiners. It is also noted that the present invention is not limited to only the aforementioned materials and as such other materials may also be used. Sufficiently high doping concentrations, typically greater 0.5 mole %, produce excellent grain refinement, and grain sizes below 1 μm can be readily attained.

Figure 2:
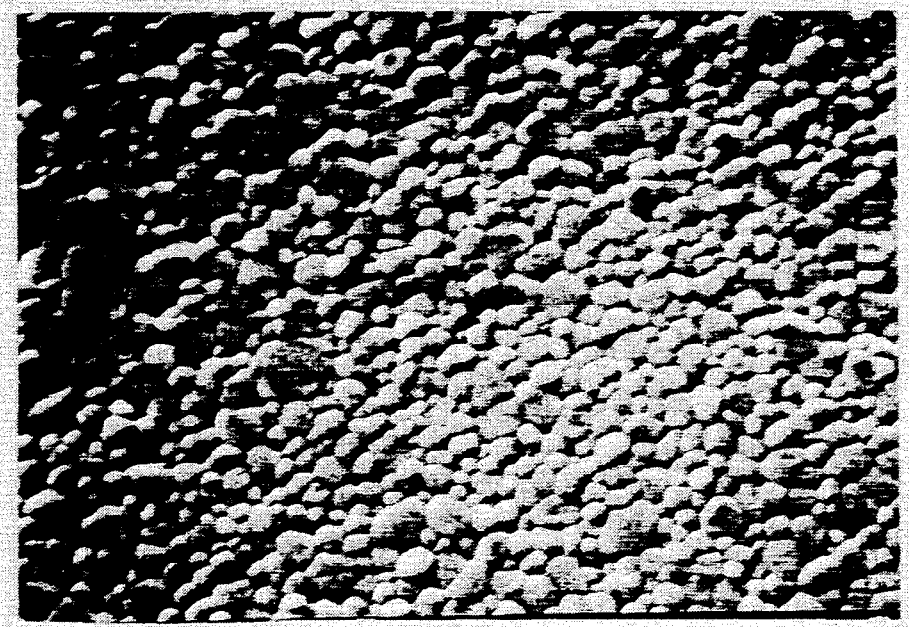
FIG. 2 illustrates the microstructure of a sample of BST doped with 0.5% Dy and 0.1% Mn.

FIG. 1 illustrates the microstructure of a regular, undoped sample of BST at a magnification of 2000×. It should be noted that grain sizes of greater than 10 μm are common. On the other hand, FIG. 2 illustrates the microstructure of a BST sample doped with 0.5% Dy and 0.1% Mn. Once again, the magnification is 2000×. Clearly the grain size is much smaller in the doped sample.

Figure 3A:
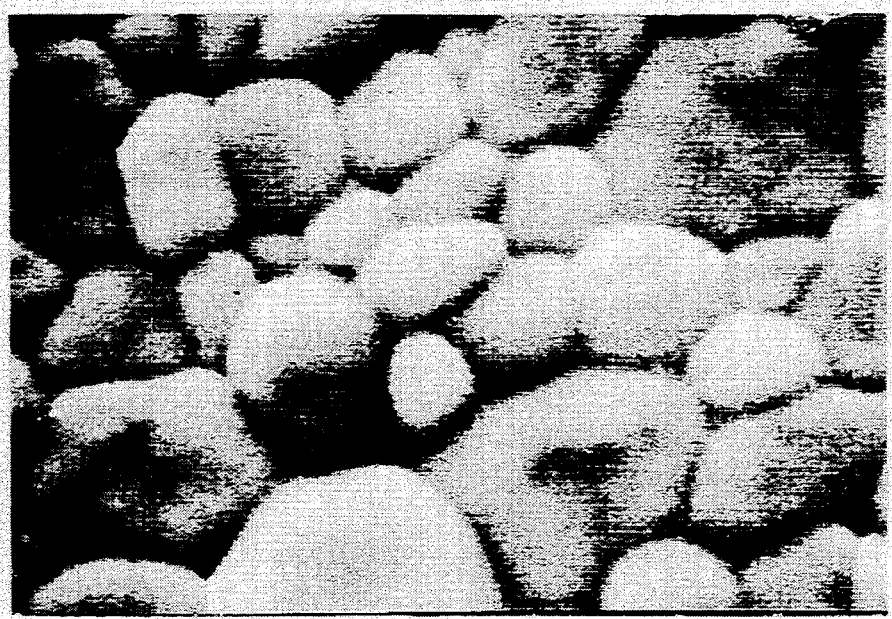
FIGS. 3a and 3b illustrate two magnifications of the microstructure of a sample of BST doped with 0.5% Ho and 0.1% Mn.
Figure 3B:
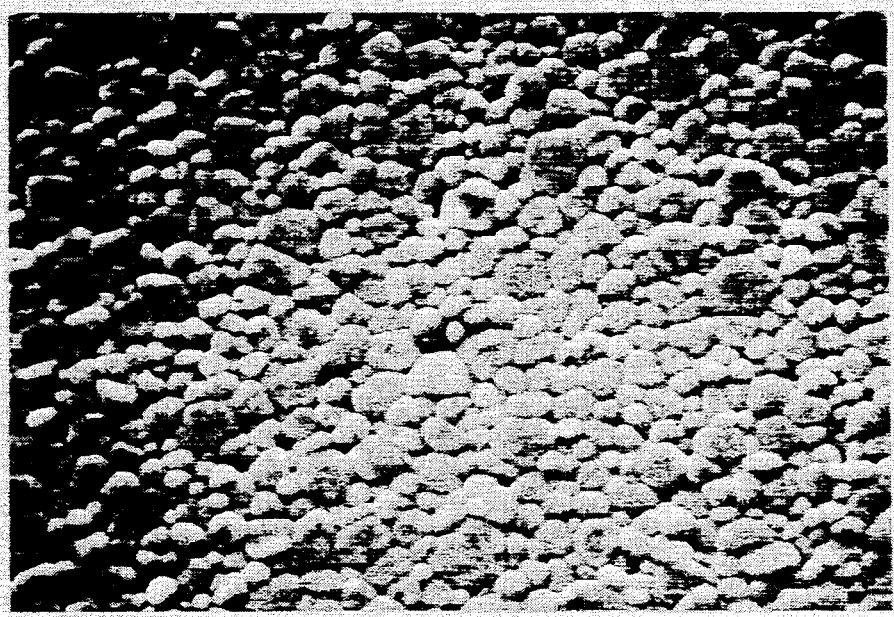

Referring now to FIG. 3, the microstructure of an additional donor-doped BST sample is illustrated. FIG. 3a illustrates the sample at a magnification of 9000× and FIG. 3b illustrates the sample at a magnification of 2000×. In this example, the BST was doped with 0.5% Ho and 0.1% Mn.

Prior art uncooled IR devices have not utilized fine-grain ceramics prepared by donor-doping which can also be made to exhibit useful electrical properties for IR imaging (e.g., pyroelectric Figure of Merit>150 nC/(cm$^{2*}$K) and electrical resistivity >5e+12 ohm-cm with 2e+3 V/cm (5 V/mil) DC bias). Using the materials and methods of the present invention described herein, fine-grain ceramics prepared by donor-doping may be used for IR imaging.

To maximize FoM implies minimizing the doping concentration, since high doping concentration would dilute the sharpness of the decay of the polarization (i.e. reduce the maximum pyroelectric coefficient). However, low doping concentration would not be effective in adequately limiting grain growth and could also yield materials having low resistivity and high loss tangent.

In addition, it has been found that purely donor-doped materials may be too conductive and therefore acceptor co-doping is typically desired to obtain sufficiently high resistivity.

Suitable acceptor co-dopants could include transition metal ions such as Co, Cu, Fe, Mn, and Ru. Other possible elements include, but are not limited to, Al, Ga, Sc, K, Na, U, In, Mg, Ni, Yb and the lanthanides beyond Er. Many of the acceptor dopants have only a single valence state (e.g., Na, Al, Ga and so forth). Experience has shown that although they do increase electrical resistivity, the concentrations required to do so may diminish pyroelectric response. It is expected that multivalent ions like Mn, Ru, Fe, . . . will be much more effective, as they are in PTC (positive temperature coefficient) resistors. Although the present invention applies to both acceptor dopants with a single valence state and those with multivalent states, preliminary experiments have shown that Mn is very effective and Na and Co appear not to be.

One notable exception when acceptor co-doping may not be necessary is when the donor density is relatively high (e.g., [D]>0.01). A material with no acceptor co-doping could be useful, for example to produce grain refinement less than one micron for very thin layers. The pyroelectric response, however, may not be as good as it would be for acceptor doped materials and therefore these factors must be considered.

Preferred doping concentrations are typically in the range of [D]=0.3 to 3.0 mole percent, preferably 0.5% to 1.0%; and [A]=0.01 to 1.0 mole percent, preferably 0.1% to 0.2% (where [D] is the donor concentration and [A] is the acceptor concentration). The preferred values are process dependent and will differ depending upon the native impurities present and their concentrations.

The nominal compositional formula for the preferred embodiment material is given as

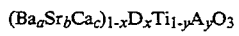

$(Ba_aSr_bCa_c)_{1-x}D_xTi_{1-y}A_yO_3$ where D comprises a trivalent donor ion (e.g., Bi, Sb, Y, La, Ce, Pr, Nd, Sin, Gd, Tb, Dy, Ho, and Er or a combination thereof) and A comprises a trivalent acceptor ion (e.g., Co, Cu, Fe, Mn, Ru, Al, Ga, Sc, U, In, Ni, and Yb or a combination thereof) or a divalent acceptor ion (e.g., Mg). It is noted that both trivalent and divalent ions reside on the Ti sub-lattice. The values for the compositional ratios are given in Table 1.

TABLE 1

| Variable | Minimum | Maximum | Preferred |
|---|---|---|---|
| a | 0.55 | 0.75 | 0.6 |
| b | 0.25 | 0.40 | 0.3 |
| c | 0.00 | 0.20 | 0.1 |
| x | 0.003 | 0.030 | .005 to .010 |
| y | 0.000 | 0.010 | .001 to .002 |

Of course, the sum of a, b, and c will be one (i.e., $a+b+c=1$).

The nominal compositional formula for a second preferred embodiment material is given as $$(Ba_a Sr_b Ca_c)Ti_{1-x-y}D_x A_y O_3$$

where D comprises a pentavalent donor ion (e.g., Nb, Ta or a combination thereof) and A comprises a trivalent or divalent acceptor ion (e.g., Co, Cu, Fe, Mn, Ru, Al, Ga, Mg, Sc, U, In, Ni, and Yb or a combination thereof). The values for the compositional ratios given in Table 1 still apply.

For the second preferred embodiment, if $y=0$ then the nominal compositional formula reduces to $$(Ba_a Sr_b Ca_c)Ti_{1-x}D_x O_3.$$

The nominal compositional formula for a third preferred embodiment material is given as $$(Ba_a Sr_b Ca_c)_{1-x-y}D_x A_y TiO_3$$

where D comprises a trivalent donor ion (e.g., Bi, Sb, Y, La, Ce, Pr, Nd, Sm, Gd, Tb, Dy, Ho, and Er or a combination thereof) and A comprises a univalent acceptor ion (e.g., K, Na or a combination thereof). Once again, the values for the compositional ratios given in Table 1 apply.

The nominal compositional formula for a fourth preferred embodiment material is given as $$(Ba_a Sr_b Ca_c)_{1-y}A_y Ti_{1-x}D_x O_3$$

where D comprises a pentavalent donor ion (e.g., Nb, Ta, or a combination thereof) and A comprises a univalent acceptor ion (e.g., K, Na or a combination thereof). Yet once again, the values for the compositional ratios given in Table 1 apply.

It is noted that the preceding formulas for the four listed embodiments do not comprehend a balance of electrical charge if x and y are not equal. Since x and y are generally different (usually $x>y$), charge compensation must occur by formation of ionic vacancies on the Ba and/or the Ti sub-lattice(s). For the first embodiment example (i.e., trivalent donors on the Ba-site and trivalent acceptors on the Ti-site), assuming that $x>y$ and compensation occurs on the Ba sub-lattice, the formula taking into account charge compensation would be:

$$[(Ba_a Sr_b Ca_c)_{1-x}D_x V_{(x-y)/2}][Ti_{1-y}A_y]O_3$$

since the difference in ionic charge substitution is $(x-y)$ and one barium vacancy (V) can compensate a charge difference of 2 (Ba has a valence of 2). If the compensation occurred on the Ti site, $(x-y)/4$ vacancies would be required.

In the present invention, it is typically desired that $x>y$, otherwise compensation could occur on the oxygen sub-lattice, and the whole idea is to avoid oxygen vacancy formation in order to restrict grain growth.

It can be seen that including the charge compensation leads to a plethora of different formulas, depending on the assumptions. It is therefore assumed that the nominal formulas given for the first four preferred embodiments encompass the variations which can be achieved to obtain charge compensation as described herein.

In an experiment, materials with the nominal composition:

$$(Ba_{0.6}Sr_{0.3}Ca_{0.1})_{1-x}D_x Ti_{0.999}Mn_{0.001}O_3$$

were prepared (actual compositions for a, b, and c varied slightly) by combining barium acetate, strontium acetate, calcium nitrate, the nitrate salt of the donor ion (D), tetraisopropyl titanate, lactic acid and water to form a common solution containing the correct molar proportions of each metal (see Faxon and McGovern, U.S. Pat. No. 3,637,531, Jan. 25, 1972). The solution was then directly pyrolized to form the mixed oxide. The calcined material was then crushed to form a fine powder, the powder was isostatically pressed into a block approximately 25 by 25 by 75 mm, and the block was sintered at 1450° C. (temperatures preferably range from about 1400° C. to 1500° C.) in oxygen to form a ceramic with a density of 97.5–99.5% of its theoretical value and a grain size of 1–3 μm.

Test capacitors were made by slicing the respective blocks and polishing the slices with decreasing particle size alumina powders, the final polish using 1 μm particles. The thinned and polished slices were contacted using screen-printed Ag/Pd thick film ink, fired at 750° C. Each test capacitor spot was nominally 0.14 inch in diameter by 0.010 inch thick. Capacitance and loss tangent were measured during heating at a rate of 0.38° C./min with a Hewlett Packard model 4284A bridge using an oscillator level of 50 mV and DC biases of zero, 2.5 V/mil (1000 V/cm) and 5 V/mil (2000 V/cm). The pyroelectric coefficient was determined during heating at 1° C./min using a Hewlett-Packard model 4140B picoammeter and DC biases of 2.5 V/mil (1000 V/mil) and 5 V/mil (2000 V/cm).

Figure 5:
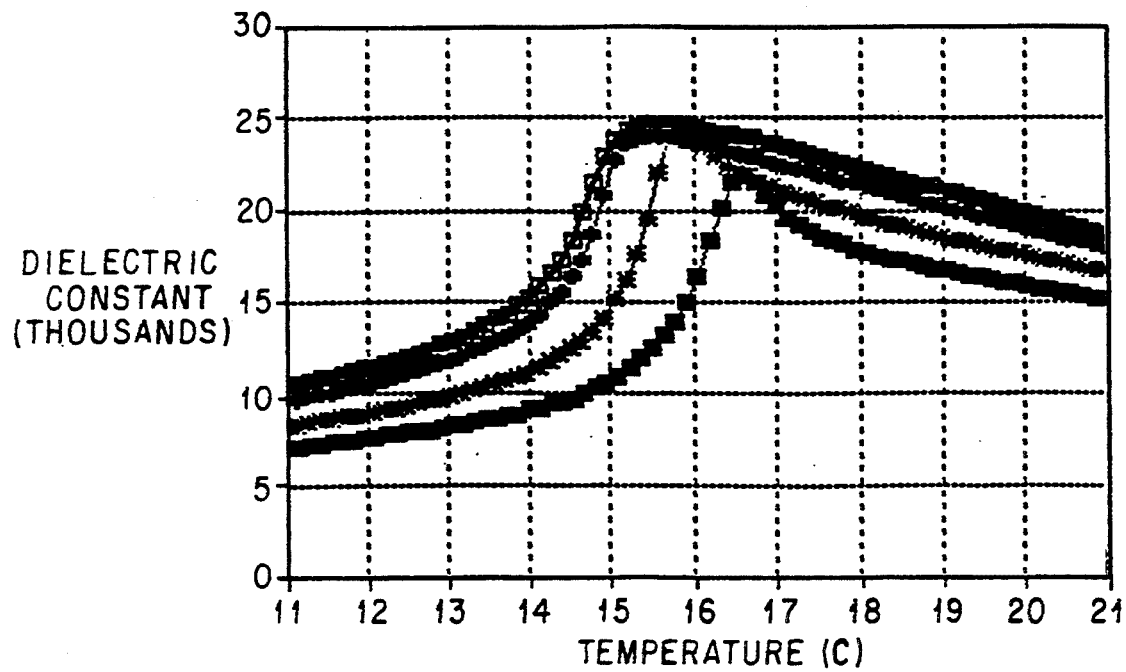
FIG. 5 illustrates the dielectric constant for a sample of BST doped with 0.7% mole % Y and 0.1 mole % Mn as a function of temperature and DC bias.
Figure 6:
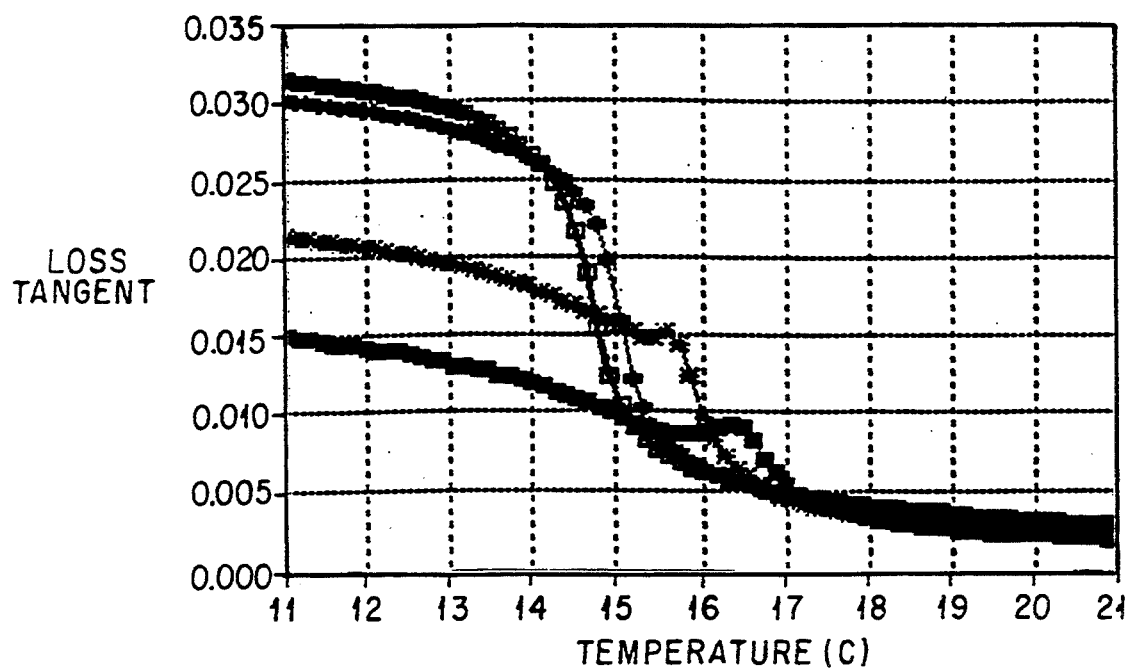
FIG. 6 illustrates the loss tangent for a sample of BST doped with 0.7% mole % Y and 0.1 mole % Mn as a function of temperature and DC bias.

Examples of pyroelectric and dielectric measurements are shown in FIGS. 4 through 6 for a material doped with 0.7 mole % Y and 0.1 mole % Mn. FIG. 4 illustrates pyroelectric coefficient as a function of temperature, FIG. 5 illustrates dielectric constant as a function of temperature, and FIG. 6 illustrates loss tangent as a function of temperature. This sample was tested up to 7.5 V/mil bias and exhibited a maximum FoM=145 nC/cm$^2$*K at 5 V/mil. A summary of the results for the other doped materials is given in Table 2. In addition to the exemplary materials listed in the tables, materials may also be prepared with lower donor concentration of 0.4 mole %. However, in experimentation these materials possessed high dielectric loss tangents and resistivities below $10^{+11}$ ohm-cm, and therefore may be too conductive for practical application.

The results shown in Table 2 indicate that excellent pyroelectric response together with high electrical resistivity is indeed feasible for properly doped fine-grain Ca-BST. Similar performance can be anticipated from doped BST. The materials doped with Tb (Sample 14J1) and Dy (Sample 14I1) exhibit FoM equivalent to the better undoped materials. Also note that in these experiments Co was not as effective for reducing the electrical conductivity, although it may be effective in future experiments.

In another experiment (sample 18T1), a FoM of 1800 was achieved at 2.5 V/mil (1 kV/cm). This material was doped with 0.5% Er and 0.1% Mn.

Figure 7:
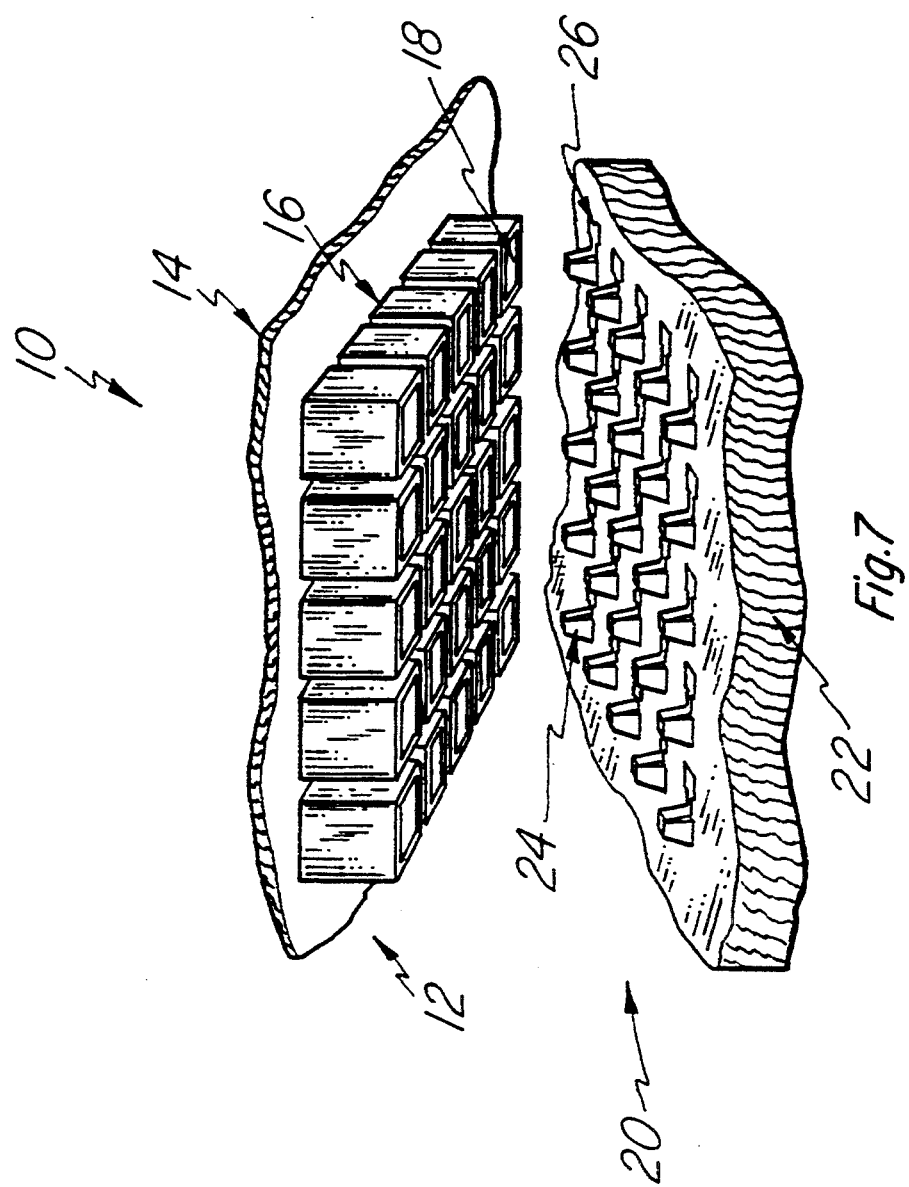
FIG. 7 illustrates an exemplary array of infrared detectors utilizing the material of the present invention.
Figure 8:
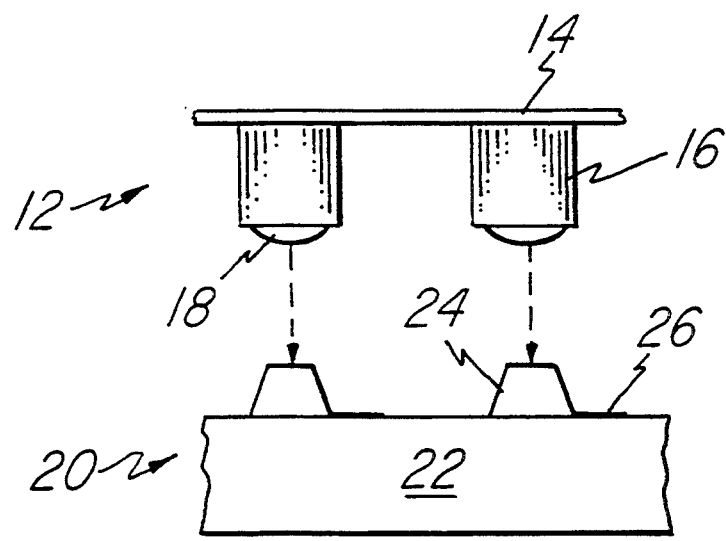
FIGS. 8 and 9 illustrate two cells of the array shown in FIG. 7.

As an example of one of the possible applications of the present invention, an exemplary array of infrared detectors 10 is illustrated in FIG. 7. Two individual pixels are illustrated in FIG. 8.

Referring now to FIG. 7, detector array 10 typically comprises two fabricated components which are bonded together. The first component 12 includes an infrared absorber and top contact layer 14. Individual BST ceramic pixels 16 are formed abutting the layer 14. Typically, the pixels 16 are formed in rows and columns as illustrated in FIG. 7, although this is not a requirement. The pixels 16 may be formed from a BST material as described hereinabove. A conductive contact 18 is formed corresponding to each of the pixels 16.

The second portion 20 of the detector array includes the semiconductor (e.g., silicon) integrated circuitry denoted generally by reference numeral 22. The detector circuitry (not shown) included in the semiconductor layer 20 may be as simple as only one address switch per matrix cell or can be expanded to also include features such as high gain preamplifiers, low pass noise filters, buffers, address switches, and other components. In general, a portion of the detection circuitry will correspond to each pixel 16.

Also corresponding to each pixel 16 is a thermal isolation mesa 24 which is formed on the surface of semiconductor layer 20. The thermal isolation mesa 24 are typically formed from polyimide and serve to thermally isolate individual pixels from their adjacent neighbors as well as the semiconductor layer 20.

Conductive contacts 26 are also formed on the surface of semiconductor layer 20 and thermal isolation mesas 24. The contacts 26 will electrically connect each pixel 16 to its corresponding portion of the detection circuitry in integrated circuitry 20 via conductive contacts 18.

Figure 9:
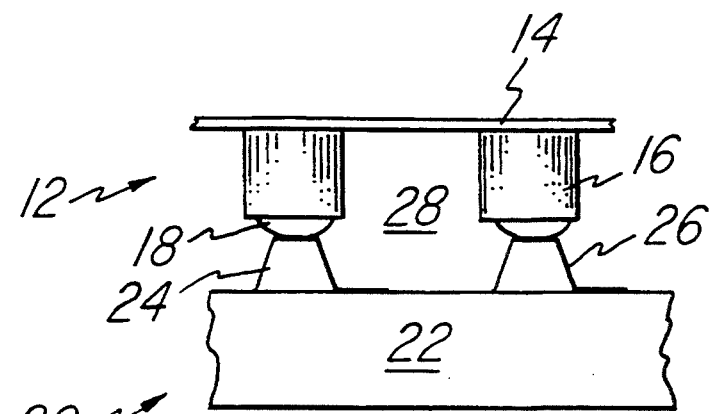

Referring now to FIG. 8, a cross-sectional view of two pixels is illustrated. The first portion 12 and second portion 20 of the detector array will be attached as illustrated by the arrows. The preferred embodiment process for attaching the portions is bump bonding which is well known in the art. In general, regions of metal such as indium are formed on the contacts 18 and 26 and the two portions are physically pressed together (and possibly heated) to form a stable mechanical bond. The bonded detector is illustrated in FIG. 9.

It is also noted that air gaps 28 separate the individual pixels 16 from one another to provide increased thermal isolation.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 2

| Sample | Donor | mole % | Acceptor | mole % | Sample g.s | $p_{max}$ | FoM | E | $\rho$ Ohm-cm |
| --- | --- | --- | --- | --- | --- | --- | --- | --- | --- |
| 11F1 | Y | 0.6 | Mn | 0.1 | 4.2 | 1.2 | 82 | 5.0 | 2.5E + 13 |
| 12D1 | Y | 0.7 | Mn | 0.1 | 1.0 | 2.0 | 119 | 5.0 | 2.0E + 13 |
| 12E1 | Y | 0.7 | co | 0.1 | 1.0 | — | — | — | 1.4E + 4* |
| 12F1 | Y | 0.8 | Mn | 0.1 | 1.1 | 1.5 | 98 | 5.0 | 3.0E + 13 |
| 12G1 | La | 0.6 | Mn | 0.1 | 0.8 | 0.85 | 98 | 5.0 | 3.0E + 13 |
| 12H1 | La | 0.7 | Mn | 0.1 | 0.9 | 0.55 | 33 | 5.0 | 2.4E + 13 |
| 13H1 | Y | 0.7 | Mn | 0.1 | 1.7 | 1.8 | 98 | 5.0 | 2.8E + 13 |
| 13I1** | Y | 0.7 | Mn | 0.1 | 1.7 | 1.9 | 118 | 5.0 | 4.2E + 13 |
| 13J1*** | Y | 0.7 | Mn | 0.1 | 1.7 | 2.7 | 145 | 5.0 | 9.6E + 13 |
| 13K1 | La | 0.5 | Mn | 0.1 | 1.8 | 1.3 | 100 | 5.0 | 2.3E + 13 |
| 14G1 | Sm | 0.5 | Mn | 0.1 | 1.8 | 3.8 | 173 | 2.5 | 1.4E + 13 |
| 14G1 | Sm | 0.5 | Mn | 0.1 | 1.8 | 2.1 | 138 | 5.0 | 1.4E + 13 |
| 14H1 | Gd | 0.5 | Mn | 0.1 | 2.5 | 1.3 | 96 | 5.0 | 4.3E + 13 |
| 14I1 | Dy | 0.5 | Mn | 0.1 | 2.5 | 6.3 | 221 | 2.5 | 1.9E + 13 |
| 14I1 | Dy | 0.5 | Mn | 0.1 | 2.5 | 3.9 | 225 | 5.0 | 1.9E + 13 |
| 14J1 | Tb | 0.5 | Mn | 0.1 | 2.2 | 6.8 | 296 | 2.5 | 1.8E + 13 |
| 14J1 | Tb | 0.5 | Mn | 0.1 | 2.2 | 3.4 | 196 | 5.0 | 1.8E + 13 |
| 14K1 | La | 0.5 | Mn | 0.1 | 2.4 | 1.6 | 115 | 5.0 | 2.0E + 13 |

Sample = Lot Number
Sample g.s = Average Grain Size ($\mu$m)
$p_{max}$ = Peak Pyroelectric Coefficient
FoM = Figure of Merit
E = Electric Filed (V/mil)
$\rho$ = resistivity
*Conductive
**+0.1% excess Ti
***+0.2% excess Ti

What is claimed is:

1. A structure for detecting energy in the infrared spectral range comprising:
   detection circuitry formed in a semiconductor layer;
   a thermal isolation mesa formed on a surface of said semiconductor layer;
   a ceramic pixel comprising polycrystalline barium strontium titanate doped with at least one donor element such that said barium strontium titanate has a grain size less than 10 $\mu$m and a Figure of Merit greater than 90 nC/(cm$^2$*K);
   a conductive contact formed on a first surface of said ceramic pixel, said contact coupling said pixel to said detection circuitry; and
   an absorbing layer for absorbing said infrared energy thereby heating said ceramic pixel.

2. The structure of claim 1 wherein said barium strontium titanate doped with said at least one donor element has a nominal formula of:

$$(Ba_aSr_bCa_c)_{1-x}D_xTi_{1-y}A_yO_3$$

wherein:
- D comprises a trivalent donor ion selected from the group consisting of Bi, Sb, Y, La, Ce, Pr, Nd, Sm, Gd, Tb, Dy, Ho, Er, and combinations thereof;
- A comprises an acceptor ion selected from the group consisting of Co, Cu, Fe, Mn, Ru, Al, Ga, Mg, Sc, U, In, Ni, Yb, and combinations thereof;
- a is equal to or greater than 0.55 and a is equal to or less than 0.75;
- b is equal to or greater than 0.25 and b is equal to or less than 0.40;
- c is equal to or greater than 0 and c is equal to or less than 0.20;
- the sum of a, b, and c is one;
- x is equal to or greater than 0.003 and x is equal to or less than 0.030; and
- y is equal to or greater than 0 and y is equal to or less than 0.010.

3. The structure of claim 2 wherein:
- a is about 0.6;
- b is about 0.3;
- c is about 0.1;
- x is equal to or greater than 0.005 and x is equal to or less than 0.010; and
- y is equal to or greater than 0.001 and y is equal to or less than 0.002.

4. The structure of claim 2 wherein said nominal formula is:

$$[(Ba_aSr_bCa_c)_{1-x}D_xV_{(x-y)/2}][Ti_{1-y}A_y]O_3$$

wherein V comprises a barium vacancy.

5. The structure of claim 1 wherein said barium strontium titanate doped with said at least one donor element has a nominal formula of:

$$(Ba_aSr_bCa_c)Ti_{1-x-y}D_xA_yO_3$$

wherein:
- D comprises a pentavalent donor ion selected from the group consisting of Nb, Ta, and combinations thereof;
- A comprises a trivalent acceptor ion selected from the group consisting of Co, Cu, Fe, Mn, Ru, Al, Ga, Mg, Sc, U, In, Ni, Yb, and combinations thereof;
- a is equal to or greater than 0.55 and a is equal to or less than 0.75;
- b is equal to or greater than 0.25 and b is equal to or less than 0.40;
- c is equal to or greater than 0.00 and c is equal to or less than 0.20;
- the sum of a, b, and c is one;
- x is equal to or greater than 0.003 and x is equal to or less than 0.030; and
- y is equal to or greater than 0.001 and y is equal to or less than 0.010.

6. The structure of claim 5 wherein:
- a is about 0.6;
- b is about 0.3;
- c is about 0.1;
- x is equal to or greater than 0.005 and x is equal to or less than 0.010; and
- y is equal to or greater than 0.001 and y is equal to or less than 0.002.

7. The structure of claim 1 wherein said barium strontium titanate doped with said at least one donor element has a nominal formula of:

$$(Ba_aSr_bCa_c)_{1-x-y}D_xA_yTiO_3$$

wherein:
- D comprises a trivalent donor ion selected from the group consisting of Bi, Sb, Y, La, Ce, Pr, Nd, Sm, Gd, Tb, Dy, Ho, Er, and combinations thereof;
- A comprises a univalent acceptor ion selected from the group consisting of K, Na, and combinations thereof;
- a is equal to or greater than 0.55 and a is equal to or less than 0.75;
- b is equal to or greater than 0.25 and b is equal to or less than 0.40;
- c is equal to or greater than 0.00 and c is equal to or less than 0.20;
- the sum of a, b, and c is one;
- x is equal to or greater than 0.003 and x is equal to or less than 0.030; and
- y is equal to or greater than 0.001 and y is equal to or less than 0.010.

8. The structure of claim 7 wherein:
- a is about 0.6;
- b is about 0.3;
- c is about 0.1;
- x is equal to or greater than 0.005 and x is equal to or less than 0.010; and
- y is equal to or greater than 0.001 and y is equal to or less than 0.002.

9. The structure of claim 1 wherein said barium strontium titanate doped with said at least one donor element has a nominal formula of:

$$(Ba_aSr_bCa_c)_{1-y}D_xA_yTi_{1-x}O_3$$

wherein:
- D comprises a pentavalent donor ion selected from the group consisting of Nb, Ta, and combinations thereof;
- A comprises a univalent acceptor ion selected from the group consisting of K, Na, and combinations thereof;
- a is equal to or greater than 0.55 and a is equal to or less than 0.75;
- b is equal to or greater than 0.25 and b is equal to or less than 0.40;
- c is equal to or greater than 0.00 and c is equal to or less than 0.20;
- the sum of a, b, and c is one;
- x is equal to or greater than 0.003 and x is equal to or less than 0.030; and
- y is equal to or greater than 0.001 and y is equal to or less than 0.010.

10. The structure of claim 9 wherein:
- a is about 0.6;
- b is about 0.3;
- c is about 0.1;
- x is equal to or greater than 0.005 and x is equal to or less than 0.010; and
- y is equal to or greater than 0.001 and y is equal to or less than 0.002.

* * * * *